US009147623B2

(12) United States Patent
Lua et al.

(10) Patent No.: US 9,147,623 B2
(45) Date of Patent: Sep. 29, 2015

(54) STACKED MICROELECTRONIC DEVICES AND METHODS FOR MANUFACTURING STACKED MICROELECTRONIC DEVICES

(71) Applicant: Micron Technology, Inc., Boise, ID (US)

(72) Inventors: Edmund Koon Tian Lua, Singapore (SG); See Hiong Leow, Singapore (SG); Choon Kuan Lee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/457,000

(22) Filed: Aug. 11, 2014

(65) Prior Publication Data

US 2014/0346683 A1    Nov. 27, 2014

Related U.S. Application Data

(60) Continuation of application No. 13/934,536, filed on Jul. 3, 2013, now Pat. No. 8,803,307, which is a division of application No. 13/346,402, filed on Jan. 9, 2012, now Pat. No. 8,501,546, which is a division of application No. 11/871,340, filed on Oct. 12, 2007, now Pat. No. 8,093,702.

(30) Foreign Application Priority Data

Aug. 16, 2007    (SG) ................. 200706007-2

(51) Int. Cl.
*H01L 23/16*    (2006.01)
*H01L 23/00*    (2006.01)
(Continued)

(52) U.S. Cl.
CPC ............... *H01L 23/16* (2013.01); *H01L 21/50* (2013.01); *H01L 23/498* (2013.01); *H01L 24/48* (2013.01); *H01L 24/49* (2013.01); *H01L 24/85* (2013.01);
(Continued)

(58) Field of Classification Search
None
See application file for complete search history.

(56) References Cited

U.S. PATENT DOCUMENTS 6,780,749 B2    8/2004    Masumoto et al.
6,946,325 B2    9/2005    Yean et al.
(Continued)

FOREIGN PATENT DOCUMENTS

JP    2003303937 A    10/2003
JP    2005243754 A    9/2005
(Continued)

OTHER PUBLICATIONS

International Search Report and Written Opinion of the International Searching Authority issued Mar. 12, 2009 in International Application No. PCT/US2008/071500.
(Continued)

*Primary Examiner* — Thao P Le
(74) *Attorney, Agent, or Firm* — Perkins Coie LLP

(57) ABSTRACT

Stacked microelectronic devices and methods of manufacturing stacked microelectronic devices are disclosed herein. In one embodiment, a method of manufacturing a microelectronic device includes forming a plurality of electrically isolated, multi-tiered metal spacers on a front side of a first microelectronic die, and attaching a back-side surface of a second microelectronic die to individual metal spacers. In another embodiment, the method of manufacturing the microelectronic device may further include forming top-tier spacer elements on front-side wire bonds of the first die.

18 Claims, 11 Drawing Sheets

(51) Int. Cl.
  *H01L 25/065* (2006.01)
  *H01L 21/50* (2006.01)
  *H01L 23/498* (2006.01)
  *H01L 25/00* (2006.01)

(52) U.S. Cl.
  CPC ............ *H01L 25/0657* (2013.01); *H01L 25/50* (2013.01); *H01L 2224/0401* (2013.01); *H01L 2224/05624* (2013.01); *H01L 2224/05644* (2013.01); *H01L 2224/05647* (2013.01); *H01L 2224/32145* (2013.01); *H01L 2224/32225* (2013.01); *H01L 2224/451* (2013.01); *H01L 2224/45015* (2013.01); *H01L 2224/48091* (2013.01); *H01L 2224/48145* (2013.01); *H01L 2224/48227* (2013.01); *H01L 2224/48465* (2013.01); *H01L 2224/48477* (2013.01); *H01L 2224/4942* (2013.01); *H01L 2224/49174* (2013.01); *H01L 2224/73265* (2013.01); *H01L 2224/83138* (2013.01); *H01L 2224/85051* (2013.01); *H01L 2225/0651* (2013.01); *H01L 2225/06506* (2013.01); *H01L 2225/06575* (2013.01); *H01L 2225/06593* (2013.01); *H01L 2924/00014* (2013.01); *H01L 2924/014* (2013.01); *H01L 2924/0105* (2013.01); *H01L 2924/01005* (2013.01); *H01L 2924/01006* (2013.01); *H01L 2924/01013* (2013.01); *H01L 2924/01014* (2013.01); *H01L 2924/01015* (2013.01); *H01L 2924/01022* (2013.01); *H01L 2924/01027* (2013.01); *H01L 2924/01029* (2013.01); *H01L 2924/01033* (2013.01); *H01L 2924/01047* (2013.01); *H01L 2924/01074* (2013.01); *H01L 2924/01079* (2013.01); *H01L 2924/01082* (2013.01); *H01L 2924/14* (2013.01); *H01L 2924/30105* (2013.01)

(56) References Cited

U.S. PATENT DOCUMENTS

| | | | |
|---|---|---|---|
| 7,041,533 B1 | 5/2006 | Akram et al. | |
| 7,138,653 B1 | 11/2006 | Akram | |
| 7,189,593 B2 | 3/2007 | Lee | |
| 7,224,070 B2 | 5/2007 | Yang | |
| 8,093,702 B2* | 1/2012 | Lua et al. | 257/686 |
| 8,501,546 B2* | 8/2013 | Lua et al. | 438/127 |
| 2002/0048825 A1 | 4/2002 | Young et al. | |
| 2002/0125556 A1 | 9/2002 | Oh et al. | |
| 2002/0153602 A1* | 10/2002 | Tay et al. | 257/685 |
| 2003/0189259 A1 | 10/2003 | Kurita et al. | |
| 2004/0207065 A1 | 10/2004 | Chang et al. | |
| 2005/0184378 A1 | 8/2005 | Sasaki | |
| 2005/0205995 A1 | 9/2005 | Ishikawa et al. | |
| 2005/0212109 A1 | 9/2005 | Cherukuri et al. | |
| 2006/0175694 A1 | 8/2006 | Hsin et al. | |
| 2006/0249827 A1* | 11/2006 | Fasano et al. | 257/686 |
| 2007/0001298 A1 | 1/2007 | Ozawa et al. | |
| 2007/0013060 A1 | 1/2007 | Kwon et al. | |
| 2007/0108574 A1* | 5/2007 | Kang et al. | 257/678 |
| 2007/0152311 A1 | 7/2007 | Jayaraman et al. | |
| 2008/0001271 A1 | 1/2008 | Marcinkiewicz | |
| 2008/0142941 A1* | 6/2008 | Yew et al. | 257/686 |
| 2008/0150120 A1 | 6/2008 | Nishimura et al. | |
| 2008/0150133 A1 | 6/2008 | Nakamura et al. | |
| 2010/0013073 A1* | 1/2010 | Andry et al. | 257/686 |
| 2012/0108010 A1 | 5/2012 | Tian et al. | |
| 2013/0292854 A1 | 11/2013 | Lua et al. | |

FOREIGN PATENT DOCUMENTS

| | | |
|---|---|---|
| WO | 2005122257 A1 | 12/2005 |
| WO | 2006070863 A1 | 7/2006 |
| WO | 2007023852 A1 | 3/2007 |

OTHER PUBLICATIONS

Search Report and Written Opinion issued May 11, 2009 in Singapore Application No. 200706007-2.
Office Action (translation) issued Aug. 9, 2011 in China Application No. 200880102878.9, 6 pages.
Office Action issued Aug. 30, 2011 in Japan Application No. 2010-521074, 7 pages.
Office Action issued Jan. 9, 2012 in Taiwan Application No. 097131327, 19 pp.
Office Action issued Oct. 16, 2012 in Japan Application No. 2010-521074, 8 pages.
Office Action issued Jun. 15, 2012 in China Application No. 200880102878.9, 20 pages.
Office Action (translation) issued Mar. 11, 2013 in China Application No. 200880102878.9, 14 pages.
Office Action (translation) issued Sep. 4, 2013 in China Application No. 200880102878.9, 7 pages.
Office Action (translation) issued Dec. 30, 2013 in China Application No. 200880102878.9, 17 pages.
Office Action issued on Sep. 22, 2014 in Chinese Application No. 200880102878.9, 14 pages.

* cited by examiner

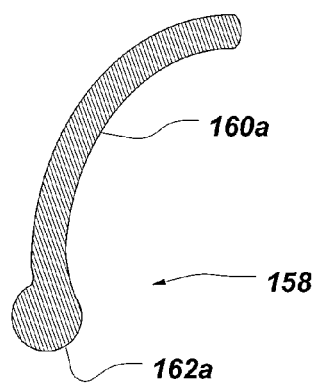
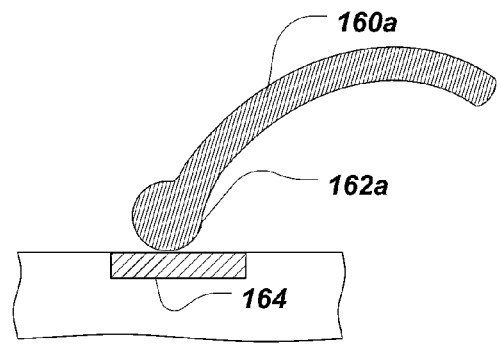
Fig. 6A Fig. 6B
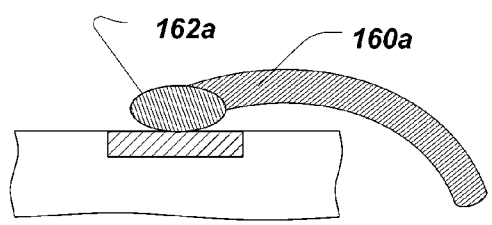
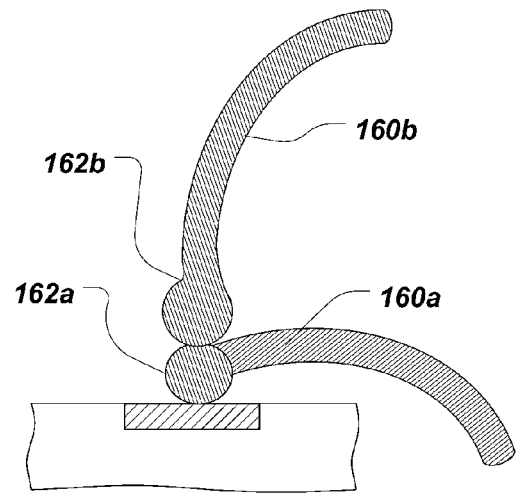
Fig. 6C Fig. 6D
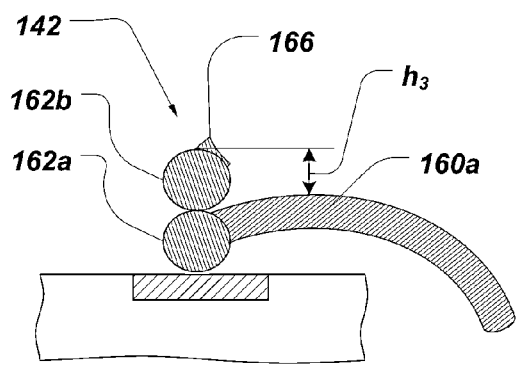
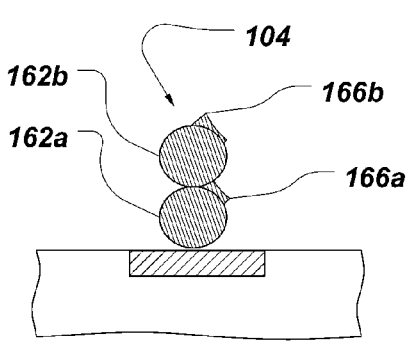
Fig. 6E Fig. 6F

US 9,147,623 B2

STACKED MICROELECTRONIC DEVICES AND METHODS FOR MANUFACTURING STACKED MICROELECTRONIC DEVICES

CROSS-REFERENCE TO RELATED APPLICATION

This application is a continuation of U.S. application Ser. No. 13/934,536 filed Jul. 3, 2013, now U.S. Pat. No. 8,803, 307, which is a divisional of U.S. application Ser. No. 13/346, 402 filed Jan. 9, 2012, now U.S. Pat. No. 8,501,546, which is a divisional of U.S. application Ser. No. 11/871,340 filed Oct. 12, 2007, now U.S. Pat. No. 8,093,702, which claims foreign priority benefits of Republic of Singapore Application No. 200706007-2 filed Aug. 16, 2007, each of which is incorporated herein by reference in its entirety.

TECHNICAL FIELD

The present disclosure is related to stacked microelectronic devices and methods for manufacturing stacked microelectronic devices.

BACKGROUND

Processors, memory devices, imagers and other types of microelectronic devices are often manufactured on semiconductor workpieces or other types of workpieces. In a typical application, several individual dies (e.g., devices) are fabricated on a single workpiece using sophisticated and expensive equipment and processes. Individual dies generally include an integrated circuit and a plurality of bond pads coupled to the integrated circuit. The bond pads provide external electrical contacts on the die through which supply voltage, signals, and other electrical parameters are transmitted to and from the integrated circuit. The bond pads are usually very small, and they are arranged in an array having a fine pitch between bond pads. The dies can also be quite delicate. As a result, after fabrication, the dies are packaged to protect the dies and to connect the bond pads to another array of larger terminals that is easier to connect to a printed circuit board.

Conventional processes for packaging dies include electrically coupling the bond pads on the dies to an array of pins, ball pads, or other types of electrical terminals, and then encapsulating the dies to protect them from environmental factors (e.g., moisture, particulates, static electricity, and physical impact). In one application, the bond pads are electrically connected to contacts on an interposer substrate that has an array of ball pads. For example, FIG. 1A schematically illustrates a conventional packaged microelectronic device 6, including a microelectronic die 10, an interposer substrate 60 attached to the die 10, a plurality of wire bonds 90 electrically coupling the die 10 to the interposer substrate 60, and a casing 70 protecting the die 10 from environmental factors.

FIG. 1B schematically illustrates another conventional packaged microelectronic device 6a having two stacked microelectronic dies 10a-b. The microelectronic device 6a includes a substrate 60a, a first microelectronic die 10a attached to the substrate 60a, a spacer 30 attached to the first die 10a with a first adhesive 22a, and a second microelectronic die 10b attached to the spacer 30 with a second adhesive 22b. The spacer 30 is a precut section of a semiconductor wafer. Other types of conventional stacked microelectronic device packages include an epoxy spacer, rather than a section of a semiconductor wafer, to space apart the first and second dies 10a-b. The epoxy spacer is formed by dispensing a discrete volume of epoxy onto the first die 10a and then pressing the second die 10b downward onto the epoxy. Epoxy spacers, however, are not rigid until cured, and thus the second dies may not be uniformly spaced apart from the corresponding first dies.

BRIEF DESCRIPTION OF THE DRAWINGS

FIGS. 6A-F illustrate stages of a method of forming a metal spacer in accordance with several embodiments of the disclosure.

DETAILED DESCRIPTION

Specific details of several embodiments of the disclosure are described below with reference to semiconductor devices and methods for fabricating semiconductor devices. The semiconductor components are manufactured on semiconductor wafers that can include substrates on which and/or in which microelectronic devices, micromechanical devices, data storage elements, optics, read/write components, and other features are fabricated. For example, SRAM, DRAM (e.g., DDR/SDRAM), flash memory (e.g., NAND flash memory), processors, imagers, and other types of devices can be constructed on semiconductor wafers. Although many of the embodiments are described below with respect to semiconductor devices that have integrated circuits, other types of devices manufactured on other types of substrates may be within the scope of the invention. Moreover, several other embodiments of the invention can have different configurations, components, or procedures than those described in this section. A person of ordinary skill in the art, therefore, will accordingly understand that the invention may have other embodiments with additional elements, or the invention may have other embodiments without several of the features shown and described below with reference to FIGS. 2A-11.

Figure 1A:
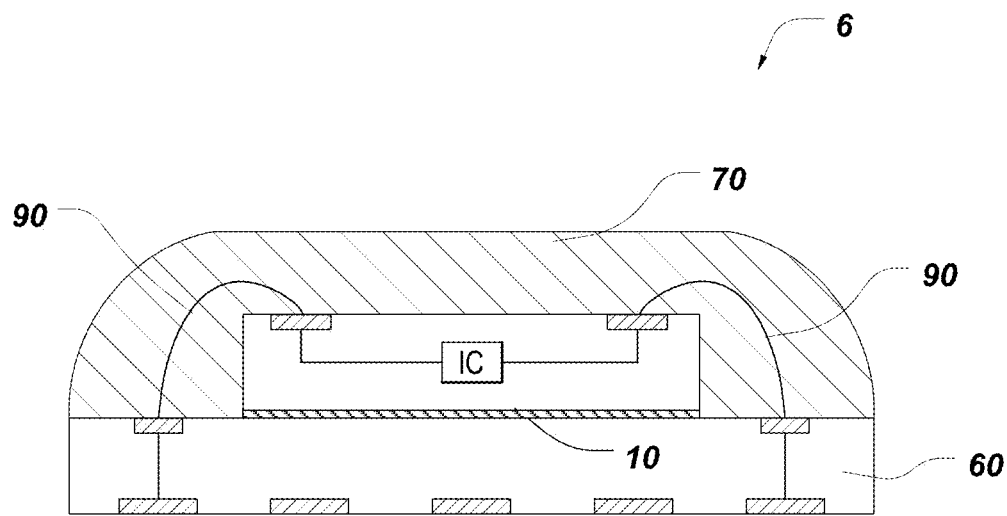
FIG. 1A schematically illustrates a conventional packaged microelectronic device in accordance with the prior art.
Figure 1B:
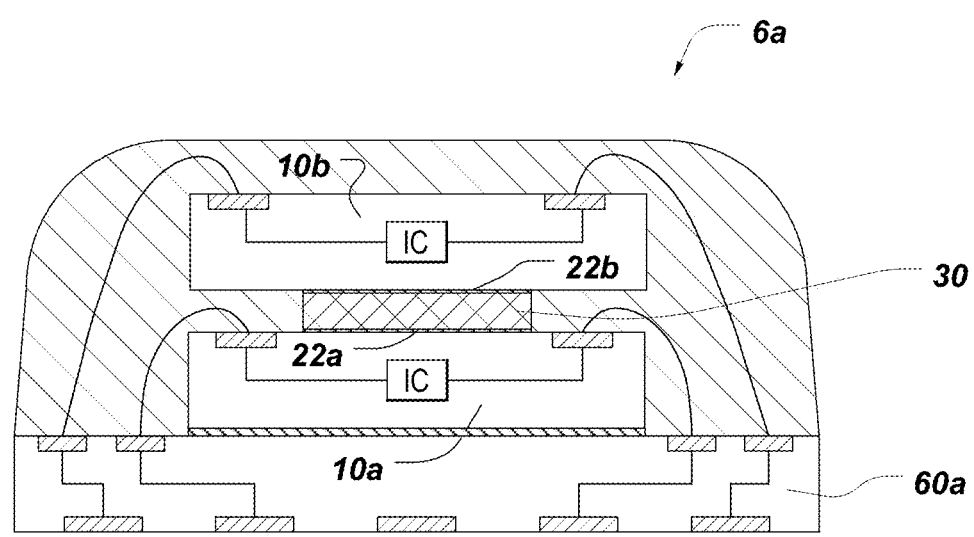
FIG. 1B schematically illustrates another conventional packaged microelectronic device in accordance with the prior art.
Figure 2A:
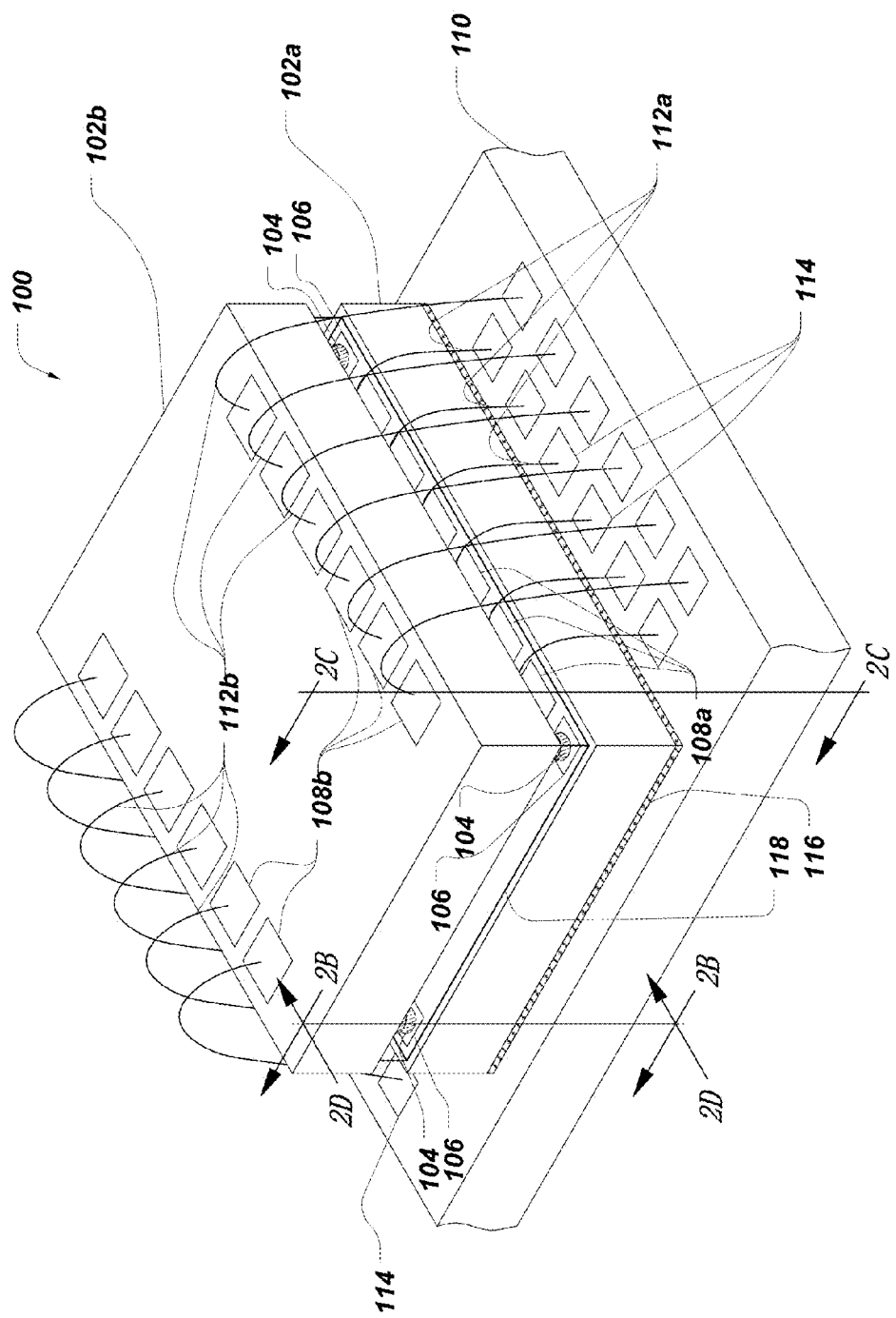
FIG. 2A is an isometric view of a stacked microelectronic die assembly having two-tiered metal spacers at the corners of the dies in accordance with one embodiment of the disclosure.

FIG. 2A is an isometric view of one embodiment of a stacked die assembly 100 that includes a first microelectronic die 102a having a front side (e.g., an active side) separated from a back side of a second microelectronic die 102b by metal spacers 104. The metal spacers 104 can be multi-tiered metal spacers comprising at least two spacer elements, and in the specific embodiment shown in FIG. 2A the spacers 104 are two-tiered metal spacers with first spacer elements and second spacer elements stacked on the first spacer elements. The metal spacers 104 are located at electrically isolated spacer sites 106 adjacent to the corners of the first die 102a. The first and second dies 102a-b can further include bond pads 108a and 108b, respectively, for electrically coupling the first and second dies 102a-b to bond pads 114 of an interposer substrate 110 (e.g., a printed circuit board). Accordingly, a plurality of first wire bonds 112a and a plurality of second wire bonds 112b, respectively, couple the first and second dies 102a-b to the bond pads 114. In addition to these electrical couplings, an adhesive layer 116 physically couples the first die 102a to the substrate 110 and a filler layer 118 adheres the second die 102b to the first die 102a. The filler layer 118 can also physically and electrically isolate individual first wire bonds 112a from each other. The filler layer 118 may comprise, for example, an epoxy, epoxy acrylic, polymide, or other suitable material, and it may be used to further attach the first die 102a to the second die 102b.

Figure 2B:
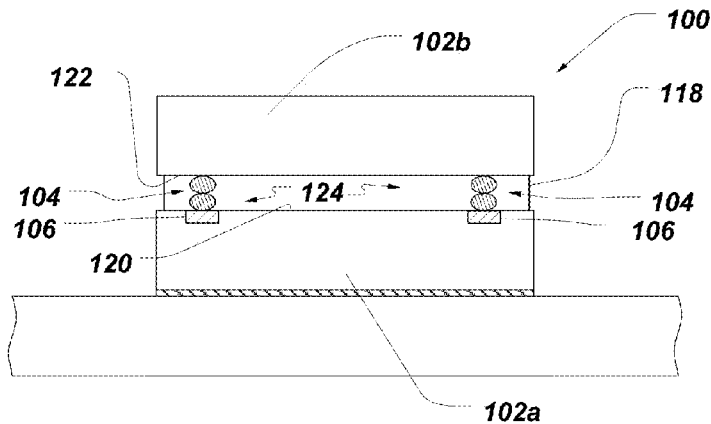
FIG. 2B is a cross-sectional view of the assembly of FIG. 2A showing metal spacers positioned on spacer bond sites.
Figure 2C:
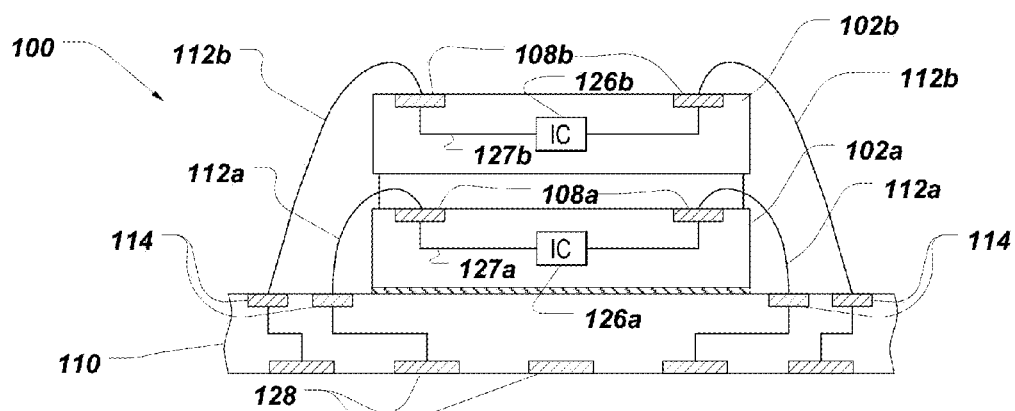
FIG. 2C is another cross-sectional view of the assembly of FIG. 2A showing interconnects passing between the stacked dies.
Figure 2D:
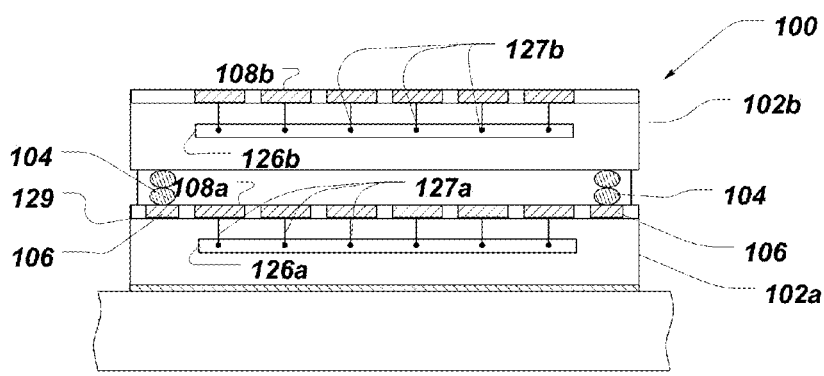
FIG. 2D is another cross-sectional view of the assembly of FIG. 2A showing electrical isolation of the metal spacers.

FIGS. 2B-D are cross-sectional views of the assembly 100 shown in FIG. 2A. FIG. 2B shows the metal spacers 104 attached to both a front-side surface 120 of the first die 102a and a back-side surface 122 of the second die 102b. In this embodiment, the metal spacers 104 have two separate elements in a stacked, two-tiered configuration. The filler layer 118 encapsulates the metal spacers 104 and fills an interior portion 124 of the assembly 100. FIG. 2C shows partial schematic diagrams associated with the first die 102a, the second die 102b, and the substrate 110. The first and second dies 102a-b, respectively, include integrated circuits (ICs) 126a and 126b and interconnect networks 127a and 127b. In general, the interconnect networks 127a-b each include stacked layers of metal lines (e.g., copper, aluminum, titanium, cobalt, etc.) and vias (e.g., copper or tungsten) that route an IC to appropriate external bond pad connections on a die. Accordingly, the interconnect network 127a routes the IC 126a to the bond pads 108a and the interconnect network 127b routes the IC 126b to the bond pads 108b. The substrate 110 couples the bond pads 108a-b through the top-side bond pads 114 to bottom-side bond pads 128. FIG. 2D shows a side view of the interconnect networks 127a-b, and electrical couplings with the corresponding bond pads 108a-b. FIG. 2D also shows electrical isolation of the spacer sites 106 from the interconnect network 127a. The spacer sites 106 are electrically isolated, at least in part, by a dielectric layer 129 that surrounds and isolates the spacer sites 106 from the bond pads 108a. The spacer sites 106 are further electrically isolated by the lack of an internal connection to the first interconnect network 127a in the first die 102a. The dielectric layer 129 can comprise a non-conductive oxide, such as deposited silicon dioxide, and the spacer sites 106 and bond pads 108a-b may comprise a variety of conventional metals or metal alloys (e.g., aluminum, copper, gold, or an alloy of these materials). The spacer sites 106, for example, can be formed during fabrication of the first die 102a concurrently with the bond pads 108a.

Because the spacer sites 106 are metallic, a conventional wire bonding and/or soldering process may be used to attach the metal spacers 104 to the spacer sites 106 for spacing the first and second dies 102a-b from each other. Returning again to FIG. 2A, a process for attaching the metal spacers 104 and stacking the first and second dies 102a-b may include, for example, forming the adhesive layer 116 on the substrate 110; attaching the first die 102a to the adhesive layer 116; forming wire bonds between the bond pads 108a and the bond pads 114; attaching the metal spacers 104 to the spacer sites 106; depositing a filler material on the front-side surface of the first die 102a; and attaching the second die 102b to the metal spacers 104.

The metal spacers 104 may be formed in a variety of ways. In one embodiment, the metal spacers 104 are made from a wire bond material and formed concurrently with a wire bonding process. In this embodiment, each tier of the individual metal spacers 104 comprises a metal bump formed by a wire bonder. In another embodiment, a soldering process could be used to form a single tier of metal bumps on the spacer sites 106 and optionally on the bond pads 108a as well. The metal bumps on the spacer sites 106 serve as a first tier of the metal spacers 104. On other hand, the metal bumps on the bond pads 108a can be used to electrically couple a wire to the first die 102a. The metal spacers 104 of this embodiment are completed by forming a second tier of metal bumps on top of the first tier of metal bumps. An alternative embodiment for forming the metal spacers 104 includes individually soldering or otherwise positioning preformed single- or multi-tiered metal spacers on the spacer sites 106. Also, in further embodiments, a packaged microelectronic device may be created by forming a casing over the assembly 100 to encapsulate the first and second dies 102a-b, the wire bonds 112a-b, and a top-side surface portion of the substrate 110. Embodiments of packaged devices are illustrated in further detail with reference to FIGS. 8-10.

The embodiment of the assembly 100 shown in FIGS. 2A-D, as well as several alternative embodiments, can mitigate or eliminate several challenges of stacking dies on each other. For example, several embodiments of the metal spacers 104 provide incompressible spacers that can be fabricated during the wire bonding process without additional equipment or processing steps. Many embodiments of the metal spacers 104 accordingly act like a silicon spacer without the cost and processing equipment needed for silicon spacers. Additionally, several embodiments of the metal spacers 104 may be placed adjacent to wire bonds or at outermost edges of a die to ensure that the first and second dies 102a-b in the assembly 100 are substantially parallel with respect to each other. Such embodiments of the metal spacers 104 accordingly avoid misalignment errors associated with epoxy spacers.

Figure 3A:
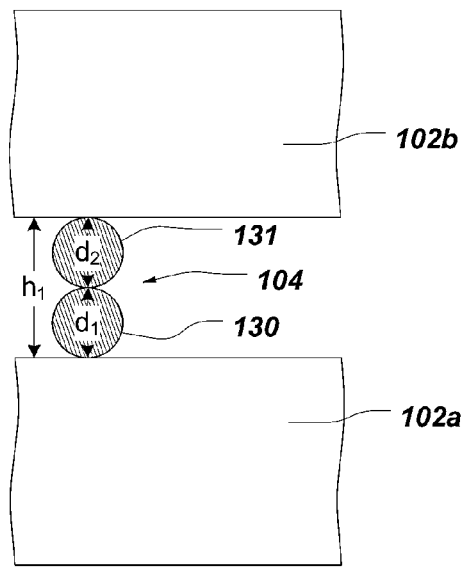
FIGS. 3A-C are cross-sectional views of metal spacers in accordance with several embodiments of the disclosure.
Figure 3B:
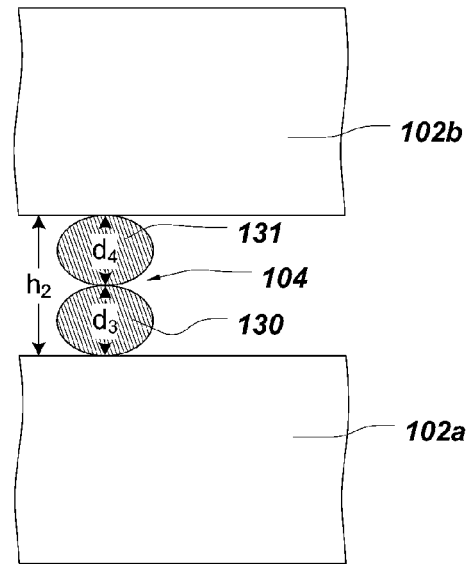
Figure 3C:
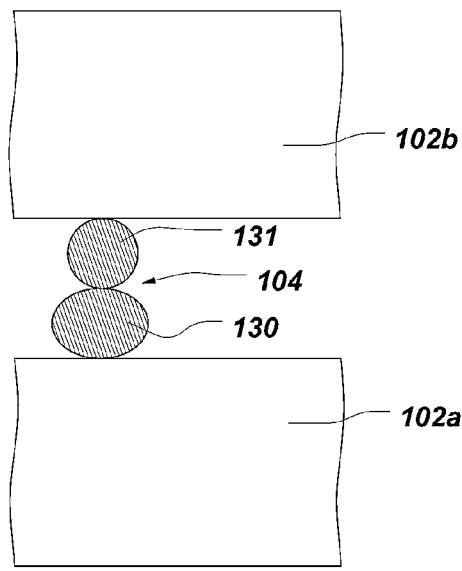

FIGS. 3A-C are cross-sectional views showing several examples of metal spacers that can be used in the stacked die assembly 100 shown in FIGS. 2A-D, or in any of the alternative embodiments described below. FIG. 3A, for example, shows an embodiment of the metal spacer 104 having first and second spacer elements, such as spherical metal bumps 130 and 131 with respective diameters $d_1$ and $d_2$. The sum of the diameters $d_1$ and $d_2$ establish a spacing distance $h_1$ between the first and second dies 102a-b. The spherical metal bumps 130 and 131 may comprise a variety of materials, such as gold, aluminum, tin, silver, lead, an alloy of these materials, or other suitable dimensionally stable materials. In one specific embodiment, the diameters $d_1$ and $d_2$ of the metal bumps can be about 10 to 75 micrometers. Thus, the spacing distance $h_1$ of such an embodiment can be approximately 20 to 150 micrometers. FIG. 3B shows an alternative embodiment of the metal spacer 104 comprising stacked metal bumps 130 and 131. Each of the metal bumps 130 and 131 is compressed along an axis creating respective minor diameters $d_3$ and $d_4$ that establish a spacing distance $h_2$ between the first and second dies 102a-b. Such compressed, flattened, or "coined" metal bumps may provide increased stability relative to purely spherically metal bumps. However, a variety of other metal bump stack configurations may be used. For example, FIG. 3C shows an embodiment of the metal spacer 104 comprising a flattened metal bump 130 that provides a wider base on which to deposit a spherical metal bump 131.

Figure 4:
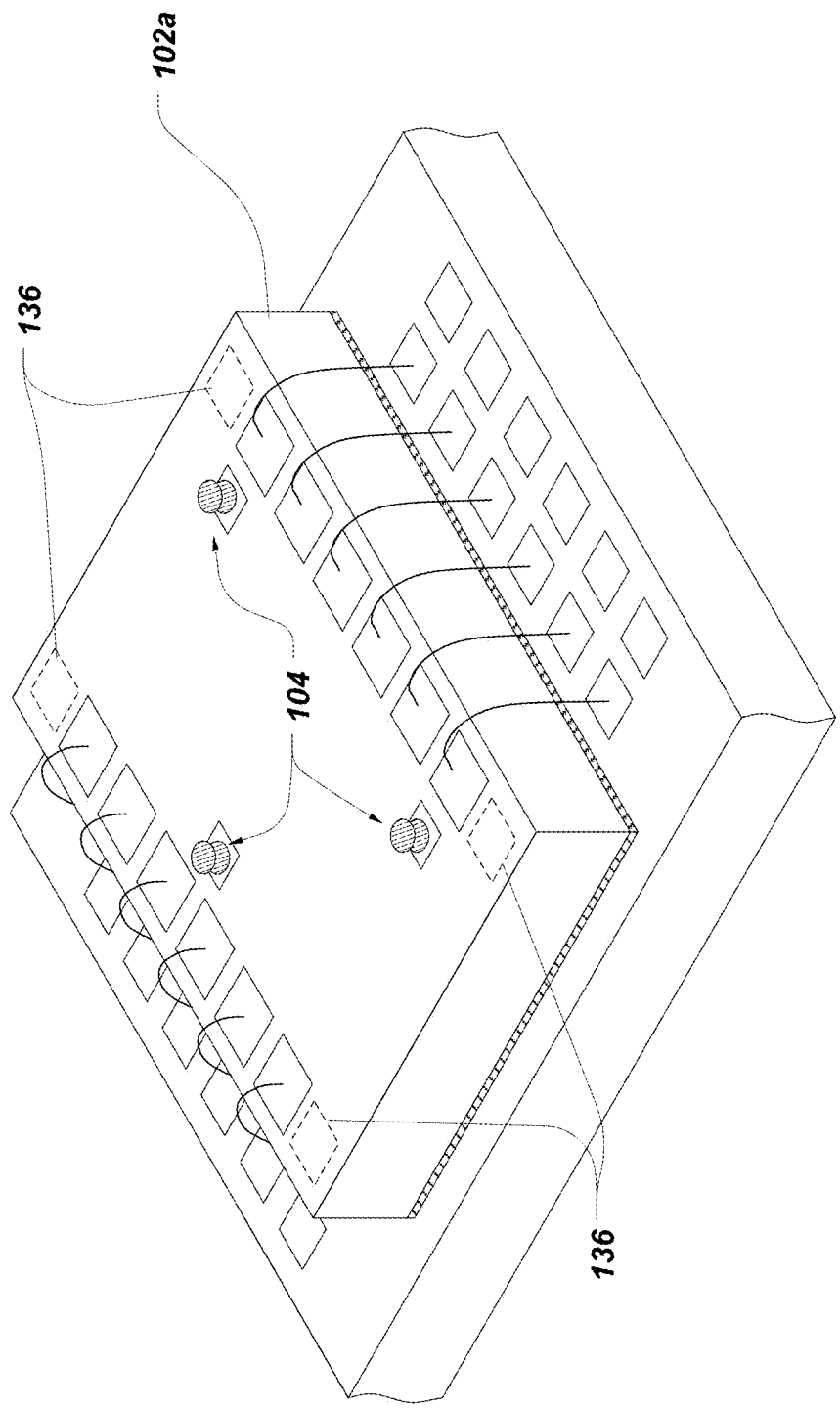
FIG. 4 is an isometric view of a microelectronic die having metal spacers placed on an interior portion of the die in accordance with another embodiment of the disclosure.

FIG. 4 is an isometric view of an embodiment showing alternative placements of the metal spacers 104 on the first die 102a. The second die 102b has been removed to show a tripod arrangement of the metal spacers 104 on an interior surface portion of the first die 102a. The arrangement of metal spacers 104 shown in FIG. 4 may allow more room for additional bond pads 136 at edges of the die 102a, and the tripod arrangement uses only three metal spacers for supporting and spacing an attached die. Other arrangements of metal spacers are also possible; alternative arrangements could include using more than three metal spacers 104 or placing metal spacers on both the interior surface and the edge surface portions of the die 102a.

Figure 5A:
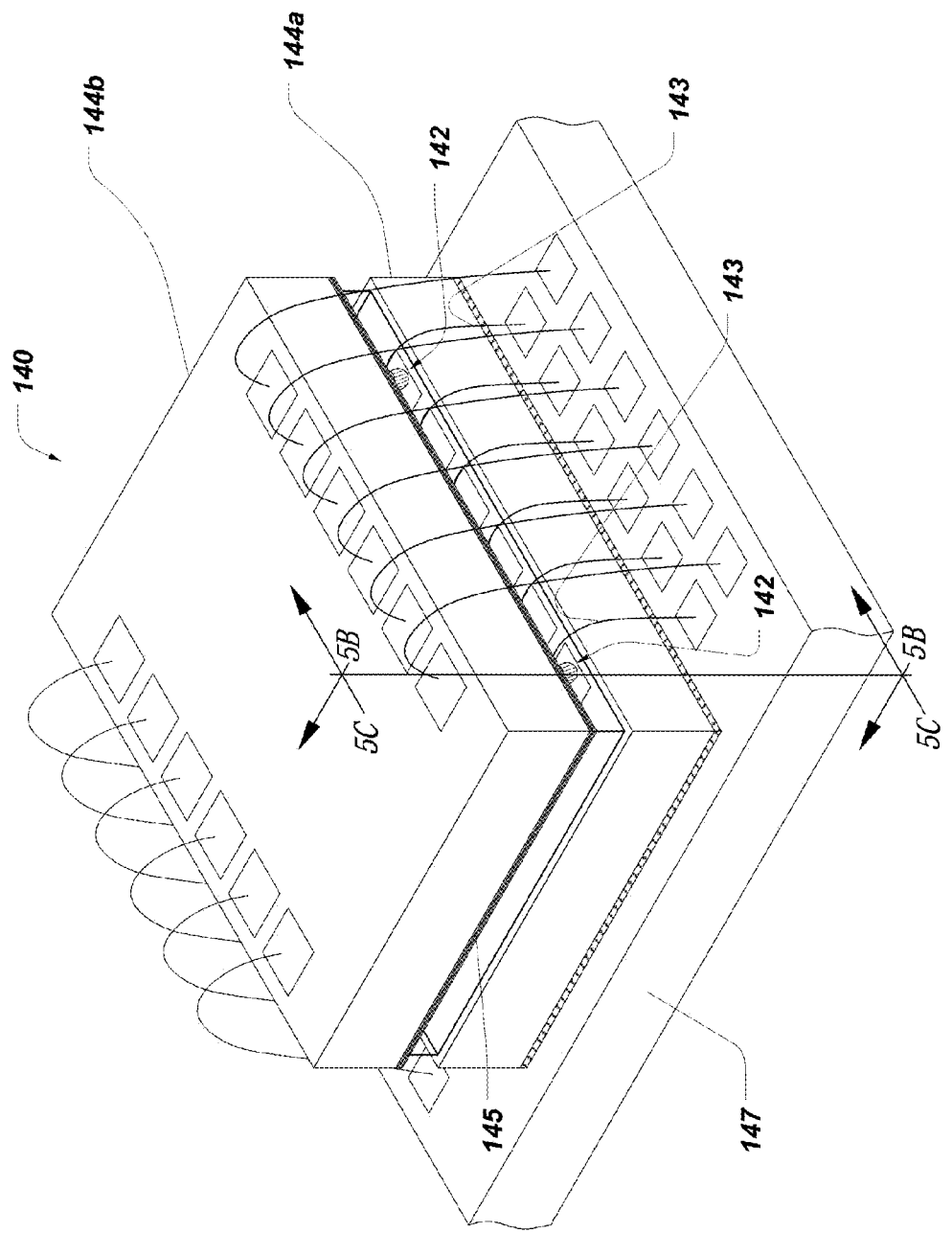
FIG. 5A is an isometric view of a stacked die assembly having stitched metal spacers in accordance with another embodiment of the disclosure.
Figure 5B:
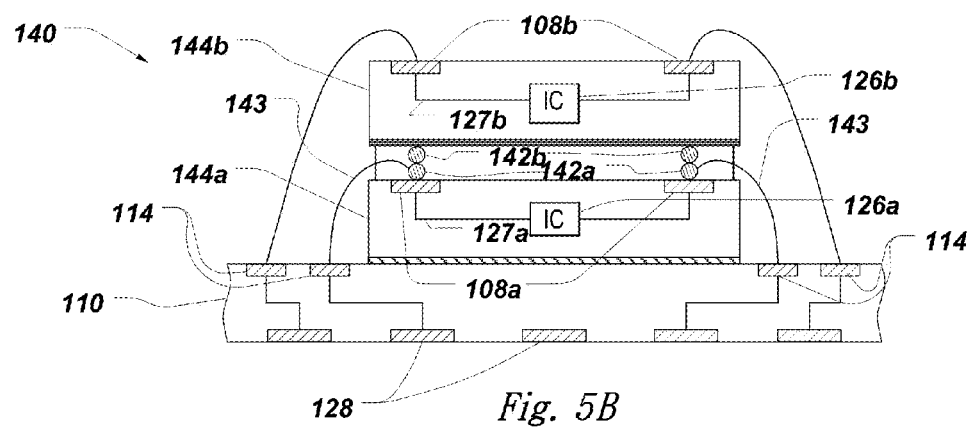
FIG. 5B is a cross-sectional view of the assembly of FIG. 5A showing the stitched metal spacers passing between the stacked dies.
Figure 5C:
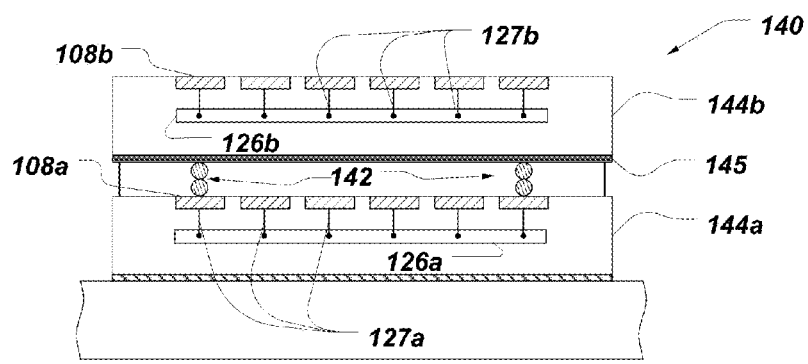
FIG. 5C is a cross-sectional view of the assembly of FIG. 5B showing electrical isolation of the stitched metal spacers.

FIGS. 5A-C illustrate an alternative embodiment of a stacked die assembly 140 having a first die 144a, a second die 144b stacked on one side of the first die 144a, and an interposer substrate 147 at the other side of the first die 144a. The first and second dies 144a-b are generally similar to the first and second dies 102a-b, but the first and second dies 144a-b do not have electrically isolated spacer sites. Instead, as best shown in FIG. 5B, the assembly 140 has "stitched" metal spacers 142 at the front side of the first die 144a and below the back side of the second die 144b. Referring to FIG. 5B, individual metal spacers 142 have a first spacer element 142a and a second spacer element 142b. The assembly 140 further includes stitched wire bonds 143 projecting from individual first spacer elements 142a. The bond pads 108a accordingly define spacer sites in lieu of the spacer sites 106 shown in FIG. 2A. In the specific embodiment shown in FIG. 5A, the stitched wire bonds 143 and metal spacers 142 are positioned only near the corners of the first and second dies 144a-b. The metal spacers 142 are also electrically active because they are on the bond pads 108a, and thus the assembly 140 further has a dielectric layer 145 on the back side of the second die 144b to electrically isolate the second die 144b from the metal spacers 142. The assembly 140 may be manufactured similarly to the process of manufacturing the assembly 100 of FIG. 2A.

FIG. 5C shows a cross-sectional view of interconnect networks 127a-b and electrical couplings with the corresponding bond pads 108a-b. FIG. 5C also shows the dielectric layer 145 on the backside of the second die 144b electrically isolating the second die 144b from the metal spacers 142. The dielectric layer 145 may comprise a variety of materials, such as, for example, an adhesive material for attaching the second die 144b to the metal spacers 142. Alternatively, the dielectric layer 145 may comprise a non-conductive oxide that has been thermally grown or deposited on the back side of the second die 144b. In general, the dielectric layer 145 should be substantially non-conductive to prevent electrical conduction between the metal spacers 142 and the second die 144b.

FIGS. 6A-E are cross-sections showing stages of an embodiment of a method for forming stitched metal spacers. In FIG. 6A, a tip 158 of a first metal wire 160a is melted to form a first metal bump 162a. The first bump 162a serves as a bottom or first spacer element of the stitched metal spacer. The diameter of the first bump 162a may be tailored by heating the tip 158 until a desired diameter is achieved. Alternatively, the overall height of a metal spacer may be adjusted by flattening a metal bump to a desired size (described further with reference to FIG. 6C). FIG. 6B shows the first wire 160a after it has been bent and pressed against a bond pad 164, for example, by a wire bonding tool. The wire bonding tool applies mechanical force, heat, and/or ultrasonic energy until a metallic connection is created between the first bump 162a and the bond pad 164. The remaining portion of the first wire 160a may then be stitched to external bond pads of the interposer substrate. In an alternative embodiment, FIG. 6C shows the first bump 162a after it has been flattened or coined by applying mechanical pressure to the top and bottom sides of the first bump 162a. An individual metal bump may be flattened immediately after formation, or all of the metal bumps on a die may be simultaneously flattened by compressing the metal bumps against a flat surface.

FIG. 6D shows a second metal bump 162b on the first bump 162a and a second wire 160b projecting from the second bump 162b. FIG. 6E shows the first and second bumps 162a-b and the metal wire 160a after the metal wire 160b has been removed, which may leave a small wire tail 166 that projects away from the metal bump 162b. The wire tail 166 may be pressed into the metal bump (i.e., via a flattening process) or the wire tail 166 may be sufficiently small so as to be negligible. The first and second bumps 162a-b form the stitched metal spacer 142. To ensure that the first wire 160a does not contact a microelectronic die stacked on the stitched metal spacer 142, the second bump 162b should extend above the first wire 160a. FIG. 6E shows a separation distance $h_3$ between the top of the second bump 162b and the first wire 160a. In certain embodiments, larger diameter metal bumps may be needed for wires having significant curvature. Alternatively, three or more stacked metal bumps may create an appropriate separation distance between the back side of a die and a curved wire (described further with reference to FIGS. 8-10).

FIG. 6F shows an embodiment of the spacer 104 that has been adapted from the stitched metal spacer 142. In this embodiment both the first and second wires 160a-b have been removed to create stacked metal bumps 162a-b. FIG. 6F also shows wire tails 166a-b projecting away from the respective metal bumps 162a-b. The wire tails 166a-b may be removed, for example, by a flattening process.

Figure 7:
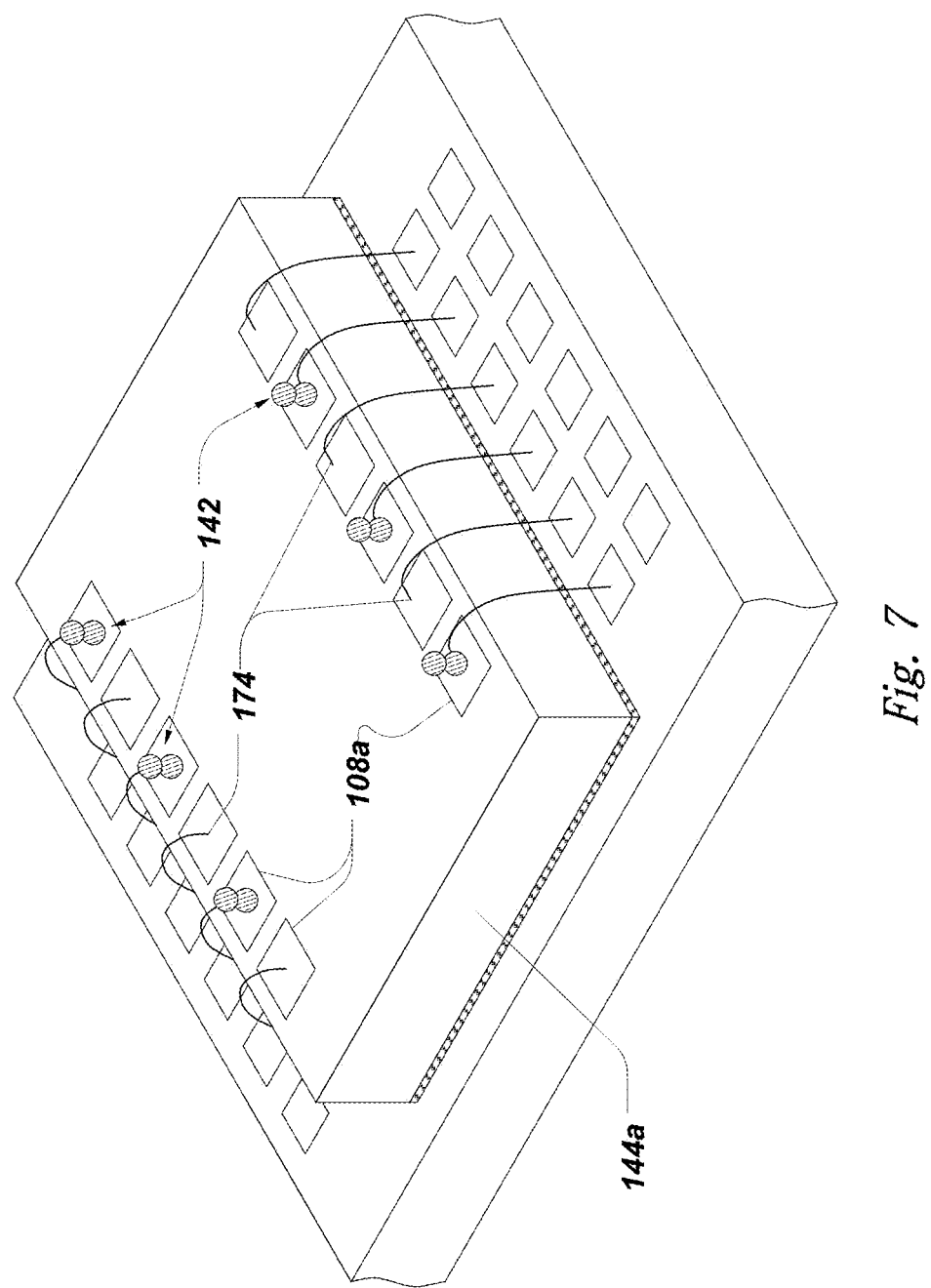
FIG. 7 is an isometric view of a microelectronic die having wire bond metal bumps and stitched metal spacers in accordance with another embodiment of the disclosure.

FIG. 7 is an isometric view of stitched metal spacer placement according to an alternative embodiment. The second die 144b (FIGS. 5A-C) has been removed in this figure to show an arrangement of the stitched metal spacers 142 on frontside bond pads 108a. The bond pads 108a alternate between conventional wire bond couplings 174 and the stitched metal spacers 142. Relative to the embodiment of the assembly 140 in FIGS. 5A-C, in which the stitched metal spacers 142 are at the corners of the dies, the arrangement of stitched and conventional wire bonds shown in FIG. 7 provides support between the first and second dies 144a-b along more points. It is also contemplated that a variety of additional arrangements are possible, such as metal spacers with both stitched and non-stitched spacer elements, and/or stitched and non-stitched spacers. For example, stitched metal spacers may be formed along edges of the first die 144a and non-stitched metal spacers may be formed at interior surface portions of the first die 144a.

Figure 8:
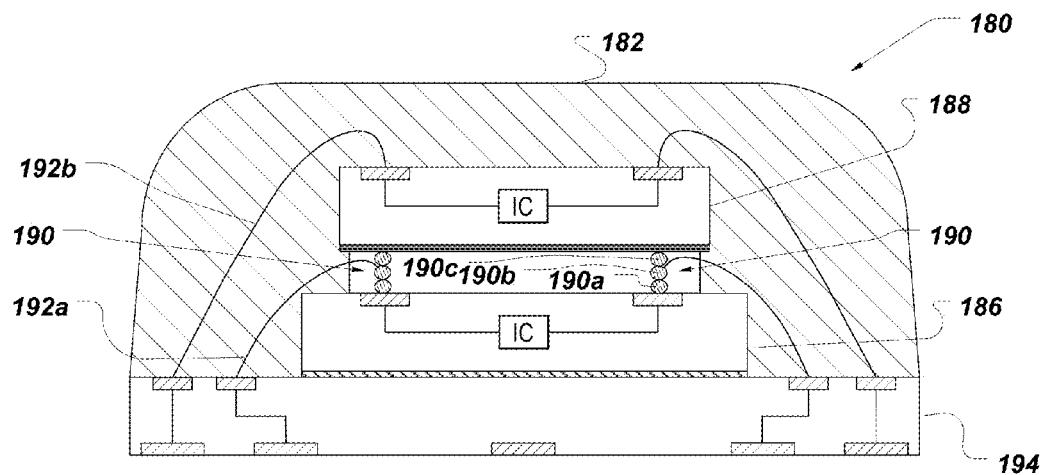
FIG. 8 is a cross-sectional view of a packaged microelectronic device having differently sized microelectronic dies and three-tiered metal spacers in accordance with another embodiment of the disclosure.

FIG. 8 is a cross-sectional view of an embodiment of a packaged microelectronic device 180 that includes a first microelectronic die 186, a second microelectronic die 188 spaced apart from the first die 186 by stitched metal spacers 190, and a casing 182 formed over the first and second dies 186 and 188. The first die 186 has a larger perimeter than the second die 188. First and second wires 192a and 192b, respectively, couple the first and second dies 186 and 188 to an interposer substrate 194. The metal spacers 190 in this embodiment include three-tiered metal spacers to provide more spacing between the first wires 192a and the second die 188. Additionally, the first wires 192a are coupled to second-tier metal bumps 190b so that the first wires 192a extend above the corner and surface portions of the first die 186. In alternative embodiments, and depending on the relative perimeter sizes of the first and second dies 186 and 188, the wires 192 can be coupled with first-tier metal bumps 190a or third-tier metal bumps 190c.

Figure 9:
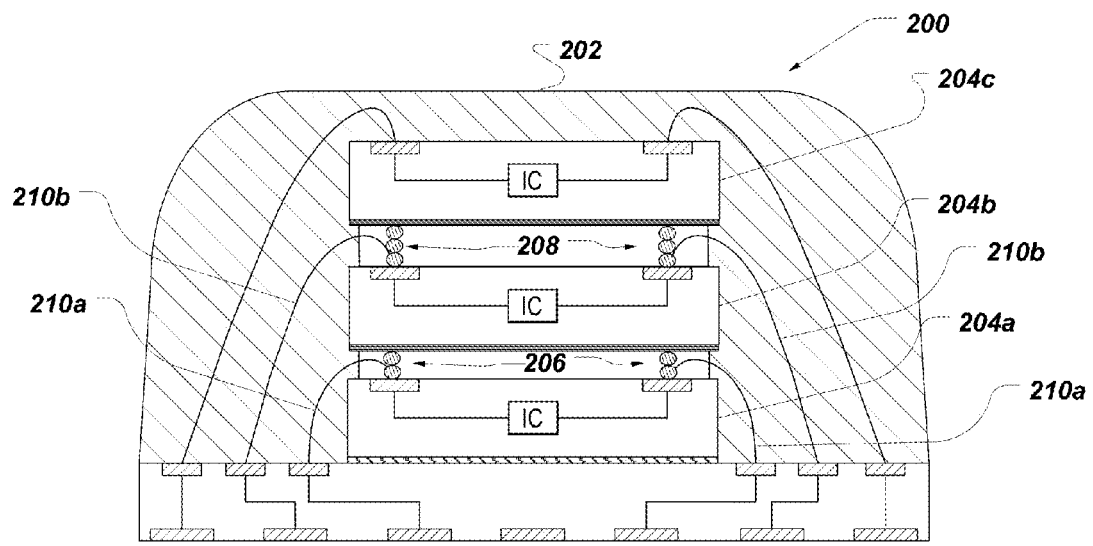
FIG. 9 is a cross-sectional view of a packaged microelectronic device having three stacked microelectronic dies and corresponding two-tiered and three-tiered metal spacers in accordance with another embodiment of the disclosure.

FIG. 9 is a cross-sectional view of another embodiment of a packaged microelectronic device 200 that includes three microelectronic dies 204a-c and a casing 202 formed over the dies 204a-c. The device 200 can have two-tiered stitched metal spacers 206 separating the first die 204a from the second die 204b and three-tiered stitched metal spacers 208 separating the second die 204b from the third die 204c. In this embodiment, the two-tiered metal spacers 206 prevent the first wires 210a from contacting a surface of the second die 204b. Because second wires 210b have a smaller radius of curvature than the first wires 210a, the additional metal bump in the three-tiered metal spacers 208 spaces the second wires 210b sufficiently apart from a back side surface of the third die 204c to prevent contact therebetween. In additional or alternative embodiments, metal spacers comprising four or more metal bumps may be used to separate individual microelectronic dies. Furthermore, other embodiments may include four or more stacked microelectronic dies.

Figure 10:
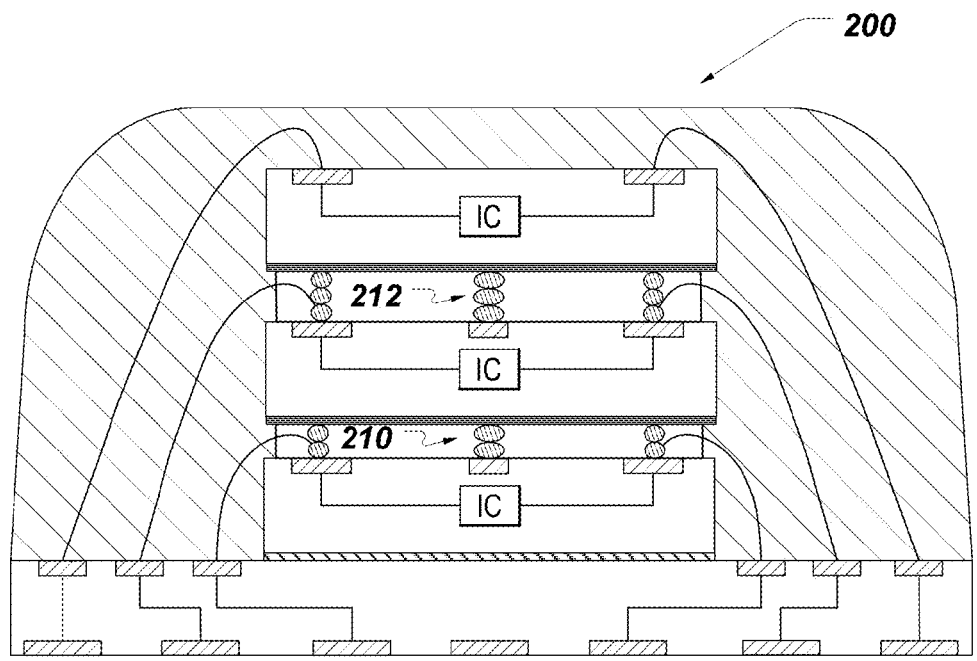
FIG. 10 is a cross-sectional view of the packaged microelectronic device of FIG. 8 further including interior metal spacers.

FIG. 10 is a cross-sectional view of the packaged microelectronic device 200 comprising non-stitched interior metal spacers 210 and 212. In this embodiment, dies supported by multi-tiered metal spacers having three or more metal bumps may receive increased structural support with interior metal spacers.

Figure 11:
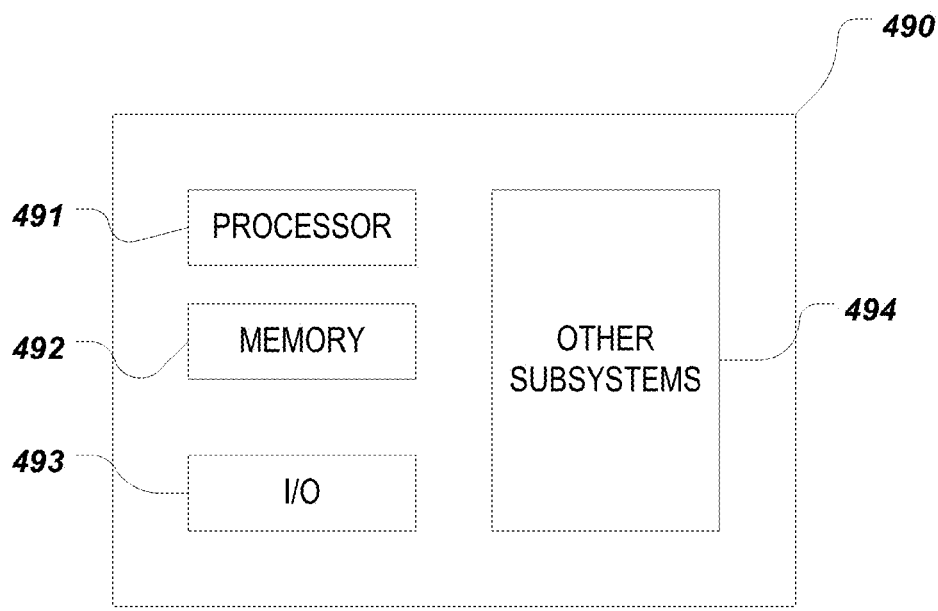
FIG. 11 is a schematic illustration of a system in which the microelectronic devices may be incorporated.

Any one of the packaged microelectronic devices described above with reference to FIGS. 2A-10 can be incorporated into any of a myriad of larger and/or more complex systems 490, a representative one of which is shown schematically in FIG. 11. The system 490 can include a processor 491, a memory 492 (e.g., SRAM, DRAM, Flash, and/or other memory device), input/output devices 493, and/or other subsystems or components 494. Microelectronic devices may be included in any of the components shown in FIG. 11. The resulting system 490 can perform any of a wide variety of computing, processing, storage, sensor, imaging, and/or other functions. Accordingly, representative systems 490 include, without limitation, computers and/or other data processors, for example, desktop computers, laptop computers, Internet appliances, hand-held devices (e.g., palm-top computers, wearable computers, cellular or mobile phones, personal digital assistants), multi-processor systems, processor-based or programmable consumer electronics, network computers, and mini computers. Other representative systems 490 include cameras, light or other radiation sensors, servers and associated server subsystems, display devices, and/or memory devices. In such systems, individual dies can include imager arrays, such as CMOS imagers. Components of the system 490 may be housed in a single unit or distributed over multiple, interconnected units, e.g., through a communications network. Components can accordingly include local and/or remote memory storage devices, and any of a wide variety of computer-readable media.

From the foregoing, it will be appreciated that specific embodiments of the invention have been described herein for purposes of illustration, but that various modifications may be made without deviating from the invention. For example, many of the elements of one embodiment can be combined with other embodiments in addition to or in lieu of the elements of the other embodiments. Additionally, in several embodiments, the metal spacers can be single, dimensionally stable posts or other stanchion-like members projecting from discrete spacer sites. Accordingly, the invention is not limited except as by the appended claims.

We claim:

1. A method of manufacturing a microelectronic device, the method comprising:
   attaching a first microelectronic die to a substrate, the first microelectronic die having a front-side surface facing away from the substrate, and a back-side surface facing the substrate;
   forming a plurality of first multi-tiered metal spacers on spacer sites at the front-side surface of the first microelectronic die, wherein each first multi-tiered metal spacer has a plurality of stacked spacer elements, and wherein at least one spacer element of the first multi-tiered metal spacers is wire-bonded to a corresponding top side bond pad on a substrate;
   forming a plurality of second multi-tiered metal spacers on the front-side surface of the first microelectronic die, wherein each second multi-tiered metal spacer has a plurality of stacked spacer elements, and wherein the second multi-tier metal spacers are attached to the spacer sites that are electrically isolated from integrated circuitry of the first microelectronic die; and
   attaching a back-side surface of a second microelectronic die to the first and second multi-tiered spacers.

2. The method of claim 1 wherein the spacer elements of the first multi-tiered spacers are formed concurrently with wire-bonds.

3. The method of claim 1 wherein the second multi-tiered metal spacers are positioned at an interior portion of the first die.

4. The method of claim 1 wherein the first and second multi-tiered spacers each have at least three spacer elements.

5. The method of claim 1 wherein the spacer elements of the first multi-tiered spacers have different diameters.

6. The method of claim 1, further comprising flattening the spacer elements of the second multi-tiered spacer.

7. The method of claim 1, further comprising flattening at least one spacer element of the first multi-tiered spacer.

8. The method of claim 1 wherein attaching the back-side surface of the second die includes depositing a filler material on the front-side surface of the first die and pressing the second die onto the filler material.

9. The method of claim 1 wherein the first and second dies have same exterior perimeters.

10. The method of claim 1 wherein the first die has an exterior perimeter that is larger than an exterior perimeter of the second die.

11. The method of claim 1, further comprising:
forming a plurality of the first multi-tiered metal spacers on a front-side surface of the second microelectronic die, wherein at least one spacer element of the first multi-tiered metal spacers is wire-bonded to a corresponding top side bond pad on a substrate;
forming a plurality of second multi-tiered metal spacers on the front-side surface of the second microelectronic die, wherein the second multi-tier metal spacers are formed over the spacer sites that are electrically isolated from integrated circuitry of the second microelectronic die; and
attaching a back-side surface of a third microelectronic die to the first and second multi-tiered spacers formed on the front-side surface of the second microelectronic die.

12. The method of claim 1, further comprising encasing the first and the second die in an encapsulant.

13. A method of manufacturing a microelectronic device, the method comprising:
attaching a first microelectronic die to a substrate, the first microelectronic die having a front-side surface with spacer sites and a back-side surface facing the substrate;
forming a plurality of multi-tiered metal spacers on spacer sites at the front-side surface of the first microelectronic die, each multi-tiered metal spacer having a plurality of stacked spacer elements;
wire-bonding at least one spacer element of the multi-tiered metal spacers to a corresponding top side bond pad on the substrate; and
attaching a back-side surface of a second microelectronic die to the multi-tiered spacers, wherein the metal spacers are electrically coupled to integrated circuits of the first microelectronic die and electrically isolated from integrated circuits of the second microelectronic die.

14. The method of claim 13 wherein the spacer elements are formed concurrently with wire bonds.

15. The method of claim 13 wherein the spacer elements of the multi-tiered spacers have different diameters.

16. The method of claim 13, further comprising flattening at least one spacer element of the multi-tiered spacers.

17. The method of claim 13 wherein attaching the back-side surface of the second die includes depositing a filler material on the front-side surface of the first die and pressing the second die onto the filler material.

18. The method of claim 13, further comprising:
forming a plurality of multi-tiered metal spacers on a front-side surface of the second microelectronic die; and
attaching a back-side surface of a third microelectronic die to the multi-tiered spacers.

* * * * *